(12) United States Patent
Centola et al.

(10) Patent No.: US 6,884,096 B2
(45) Date of Patent: Apr. 26, 2005

(54) APPARATUS FOR POSITIONING AN ELECTRICAL ASSEMBLY WITHIN A HOUSING

(75) Inventors: Bruno Centola, Vence (FR); Denis G. Roman, La Turbie (FR); Jean-Pierre Suzzoni, Cagnes-sur-mer (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,385

(22) Filed: Dec. 10, 2003

(65) Prior Publication Data

US 2004/0219811 A1 Nov. 4, 2004

(30) Foreign Application Priority Data

Apr. 29, 2003 (EP) .............................. 03368042

(51) Int. Cl.⁷ ............................................. H01R 13/62
(52) U.S. Cl. ..................................... 439/157; 361/798
(58) Field of Search ................................ 439/157, 159, 439/325, 327, 328; 361/798, 754, 755, 801, 796

(56) References Cited

U.S. PATENT DOCUMENTS

| | | | | |
|---|---|---|---|---|
| 4,197,572 A | * | 4/1980 | Aimar .......................... | 361/755 |
| 4,597,173 A | * | 7/1986 | Chino et al. .................. | 29/741 |
| 4,778,401 A | * | 10/1988 | Boudreau et al. ........... | 439/153 |
| 4,914,552 A | * | 4/1990 | Kecmer ....................... | 361/801 |
| 4,917,618 A | * | 4/1990 | Behrens et al. ............. | 439/157 |
| 4,996,631 A | * | 2/1991 | Freehauf ..................... | 361/798 |
| 5,003,431 A | * | 3/1991 | Imsdahl ....................... | 361/798 |
| 5,030,108 A | * | 7/1991 | Babow et al. ................ | 439/64 |
| 5,139,430 A | * | 8/1992 | Lewis et al. ................. | 439/157 |
| 5,140,501 A | * | 8/1992 | Takahashi et al. .......... | 361/798 |
| 5,151,041 A | * | 9/1992 | Kaiser et al. ............... | 439/157 |
| 5,162,979 A | * | 11/1992 | Anzelone et al. ........... | 361/686 |
| 5,191,970 A | * | 3/1993 | Brockway et al. .......... | 200/335 |
| 5,208,942 A | * | 5/1993 | Simon ......................... | 16/429 |
| 5,222,897 A | * | 6/1993 | Collins et al. .............. | 439/157 |
| 5,293,303 A | * | 3/1994 | Fletcher et al. ............. | 361/798 |
| 5,309,325 A | * | 5/1994 | Dreher et al. ............... | 361/754 |
| 5,317,480 A | * | 5/1994 | Chandraiah et al. ........ | 361/785 |
| 5,317,482 A | * | 5/1994 | Bujtas ......................... | 361/798 |
| 5,340,340 A | * | 8/1994 | Hastings et al. ............. | 439/64 |
| 5,373,419 A | * | 12/1994 | Wright ........................ | 361/755 |
| 5,386,346 A | * | 1/1995 | Gleadall ...................... | 361/799 |
| 5,398,164 A | * | 3/1995 | Goodman et al. .......... | 361/752 |
| 5,414,594 A | * | 5/1995 | Hristake ..................... | 361/755 |
| 5,434,752 A | * | 7/1995 | Huth et al. .................. | 361/798 |
| 5,502,622 A | * | 3/1996 | Cromwell ................... | 361/801 |
| 5,587,888 A | * | 12/1996 | Joist ............................ | 361/802 |
| 5,629,836 A | * | 5/1997 | Wright ........................ | 361/755 |
| 5,669,512 A | * | 9/1997 | Joslin ......................... | 211/41.17 |
| 5,675,475 A | * | 10/1997 | Mazura et al. .............. | 361/798 |
| 5,793,614 A | * | 8/1998 | Tollbom ..................... | 361/732 |
| 5,940,276 A | * | 8/1999 | Kurrer et al. ............... | 361/754 |
| 5,989,043 A | * | 11/1999 | Han et al. ................... | 439/157 |

(Continued)

*Primary Examiner*—Ross Gushi
(74) *Attorney, Agent, or Firm*—Anthony J. Canale

(57) ABSTRACT

An apparatus for positioning an electronic printed circuit board within a electronic chassis is disclosed. The PCB includes at least one connector and the chassis backplane includes at least one connector adapted for electrically connecting to the PCB connector when the PCB is latched within the chassis. The apparatus comprises a lever and a rod. The lever includes a first pivot means that is rotated about the edge of the chassis. The lever is movable between a first position and a second position to allow the connector mounted on the back end of the PCB to engage the backplane connector by actuating the lever downward, or to disengage the PCB connector from the backplane connector by actuating the lever upward. The rod is pivotally coupled to the PCB by a rod pivot and pivotally coupled to the lever by a lever pivot that enables movement of the rod along the same plane in which the lever is actuated.

14 Claims, 4 Drawing Sheets

U.S. PATENT DOCUMENTS

| | | | | |
|---|---|---|---|---|
| 6,147,872 A | * | 11/2000 | Roy | 361/754 |
| 6,148,506 A | * | 11/2000 | Vermette | 29/758 |
| 6,160,717 A | * | 12/2000 | Desousa et al. | 361/798 |
| 6,220,879 B1 | * | 4/2001 | Ulrich | 439/160 |
| 6,266,253 B1 | * | 7/2001 | Kurrer et al. | 361/796 |
| 6,267,614 B1 | * | 7/2001 | Good et al. | 439/327 |
| 6,361,335 B1 | * | 3/2002 | Calanni et al. | 439/152 |
| 6,381,146 B1 | * | 4/2002 | Sevier | 361/754 |
| 6,413,122 B1 | * | 7/2002 | Fujioka | 439/680 |
| 6,475,016 B1 | * | 11/2002 | Heidenreich et al. | 439/352 |
| 6,515,866 B1 | * | 2/2003 | Ulrich | 361/759 |
| 6,561,826 B1 | * | 5/2003 | Puri et al. | 439/157 |
| 6,582,241 B1 | * | 6/2003 | Lutz, Jr. | 439/157 |
| 6,648,667 B1 | * | 11/2003 | Heidenreich et al. | 439/352 |
| 6,752,641 B1 | * | 6/2004 | Puri et al. | 439/157 |

* cited by examiner

APPARATUS FOR POSITIONING AN ELECTRICAL ASSEMBLY WITHIN A HOUSING

BACKGROUND OF INVENTION

1. Technical Field

The present invention relates in general to mechanical fasteners, and in particular, to a mechanism for positioning an electronic assembly within a housing, such as, for example, a printed circuit board within an electronic chassis.

2. Background

Printed circuit boards (PCB) are used in many electronic devices, such as telecommunications equipment. In these devices, PCBs are often electrically connected to a backplane using connectors that extend from the printed circuit card and that mate with connectors located on the backplane.

Generally, mechanical systems used for insertion and extraction of PCBs comprise a handle secured to the front end of the PCB or a pair of cam levers that cooperate with the front end of the chassis and slotted rail guides dedicated to each PCB mounted in an electronic chassis assembly.

Insertion and extraction handles present the advantage of being very simple. However, the disadvantage of these systems is that they are not usable with connectors requiring a high insertion and retention force to overcome mechanical resistance to properly mate the connector.

For this type of connector, a cam lever based mechanism is better suited. Some cam lever systems further comprise a snap latch system that cooperate with a mechanical part secured to the PCB to insure an automatic latching of the PCB in the chassis. The two following patents illustrate some prior art solutions.

U.S. Pat. No. 4,233,646 from Leung discloses an improved latching lever for use with a PCB. The latching mechanism comprises a hooked portion flexibly connected to the body portion of the latching lever, an actuating member solidly connected to the hooked portion for moving the hooked portion relative to the body portion, and a stop portion, solidly connected to the body portion for limiting the movement of the actuating member. A stud carried by the PCB is engaged by the hooked portion of the lever to enable the lever to latch. Moving the actuating member to contact the stop portion disengages the hooked portion from the stud, thereby unlatching the lever, and leaving the lever free to pivot about its pivot point.

In commonly assigned U.S. Pat. No. 6,058,579, a snap latch insertion and removal lever is described. The snap latch device has a handle with a pair of cam members extending from a lower end. The device also has a flexible snap which protrudes from the handle. The front end of the snap has a barbed lip. The device is designed to interlock a shuttle assembly to a stationary chassis. The device is pivotally mounted to the shuttle which carries a board with connectors. The device is movable between an engaged position and a retracted position. In the engaged position, the cam members engage an end wall on the chassis and the snap inserts through and engages a hole in the shuttle. The mechanical interlock between the cam members and the end wall rigidly secures the shuttle in the chassis. The device is moved to the retracted position by pulling back on the snap to dislodge the barbed lip. This release allows the device to rotate so that the cam members disengage the end wall. After the snap and cam members are clear of the hole and end wall, respectively, the shuttle may be completely removed from the chassis. The shuttle may be inserted and locked into the chassis by reversing these steps. The snap provides visual and audible feedback to the installer to insure a proper connection between the mating connectors on the shuttle and chassis.

One drawback of prior art designs is that the force required to mate the PCB is applied on the front end of the card while connectors are located on the back end. This results in undesired flexing of the PCB during insertion, thereby decreasing its reliability and utility by creating a heightened risk of micro cracks within the internal signal layers of the PCB.

SUMMARY OF INVENTION

The present invention relates to an apparatus for easy insertion, latching and removal of a PCB into a chassis.

In a preferred embodiment, the apparatus for positioning an electronic PCB assembly within a chassis housing comprises a lever and a rod. The electronic PCB assembly includes at least one connector and the chassis backplane includes at least one connector adapted for electrically connecting to the PCB connector when the PCB is latched within the housing. The lever includes a mechanical pivot joint that is rotated about the edge of the chassis housing. The lever is movable between a first position and a second position to allow the connector mounted on the PCB to engage the backplane connector by actuating the lever downward, or to disengage the PCB connector from the backplane connector by actuating the lever upward. The rod is coupled to the PCB by a rod pivot and coupled to the lever by a lever pivot that enables movement of the rod along the same plane in which the lever is actuated.

The arrangement of the mechanical pivot joint, the rod pivot and the lever pivot is such that the electronic assembly is latched within the housing when the lever is set in the second position.

The lever preferably comprises a handle and the mechanical pivot joint comprises an upper cam lever and a lower cam lever that contact the housing when the handle is moved from the first position to the second position.

DETAILED DESCRIPTION

Figure 1:
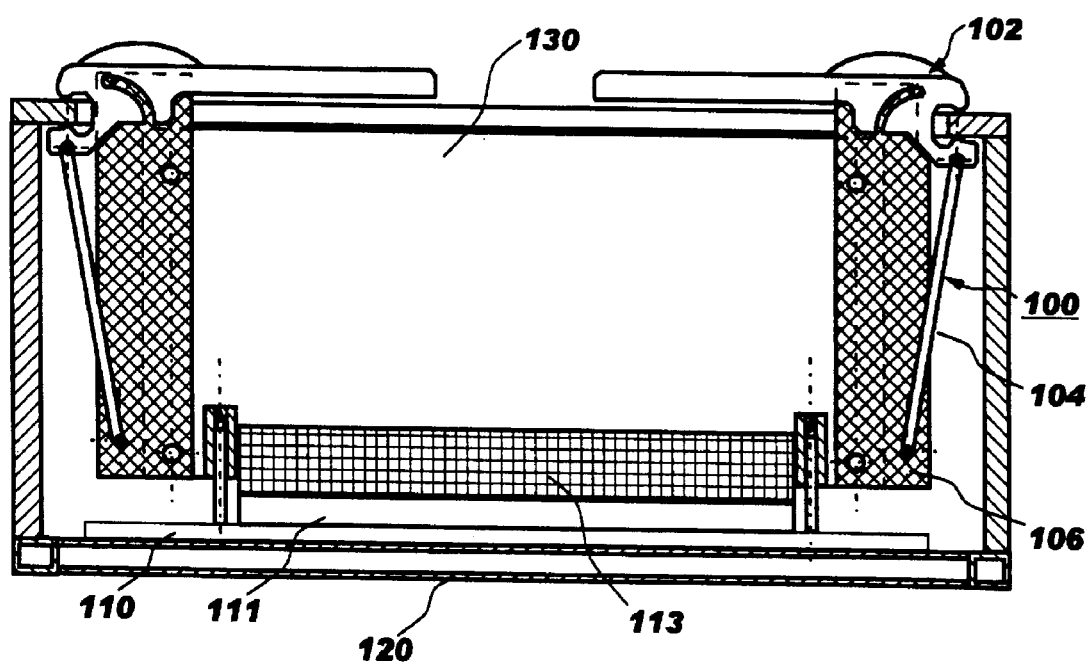
FIG. 1. Illustrates a front view of the printed circuit board, the chassis, the backplane and the apparatus according to an embodiment of the present invention.

Referring to FIG. 1, a general front view of a PCB 130 is shown. A backplane 110 is secured into a chassis 120 preferably with screws (not shown). A backplane connector 111 extends perpendicularly from backplane 110. A PCB connector 113 extends longitudinally from PCB 130.

One mechanism 100 for inserting, extracting and latching the PCB into the chassis is shown mounted on the right and the left sides, respectively, of the PCB 130. As shown in FIG. 1, mechanism 100 is comprised of a combination of a lever 102 coupled to a rod 104, extending from the lever and coupled to a holder 106 secured to the PCB. In the described embodiment, the PCB 130 is coupled to the rod 104 through the holder 106. Although this illustrates a commercial application, a person skilled in the art would appreciate that any form of coupling the rod to the PCB would allow the mechanism to operate. Specifically, a direct coupling of the rod 104 to a printed circuit card would be suitable for phone cards or single in-line module (SIM) cards.

Figure 2:
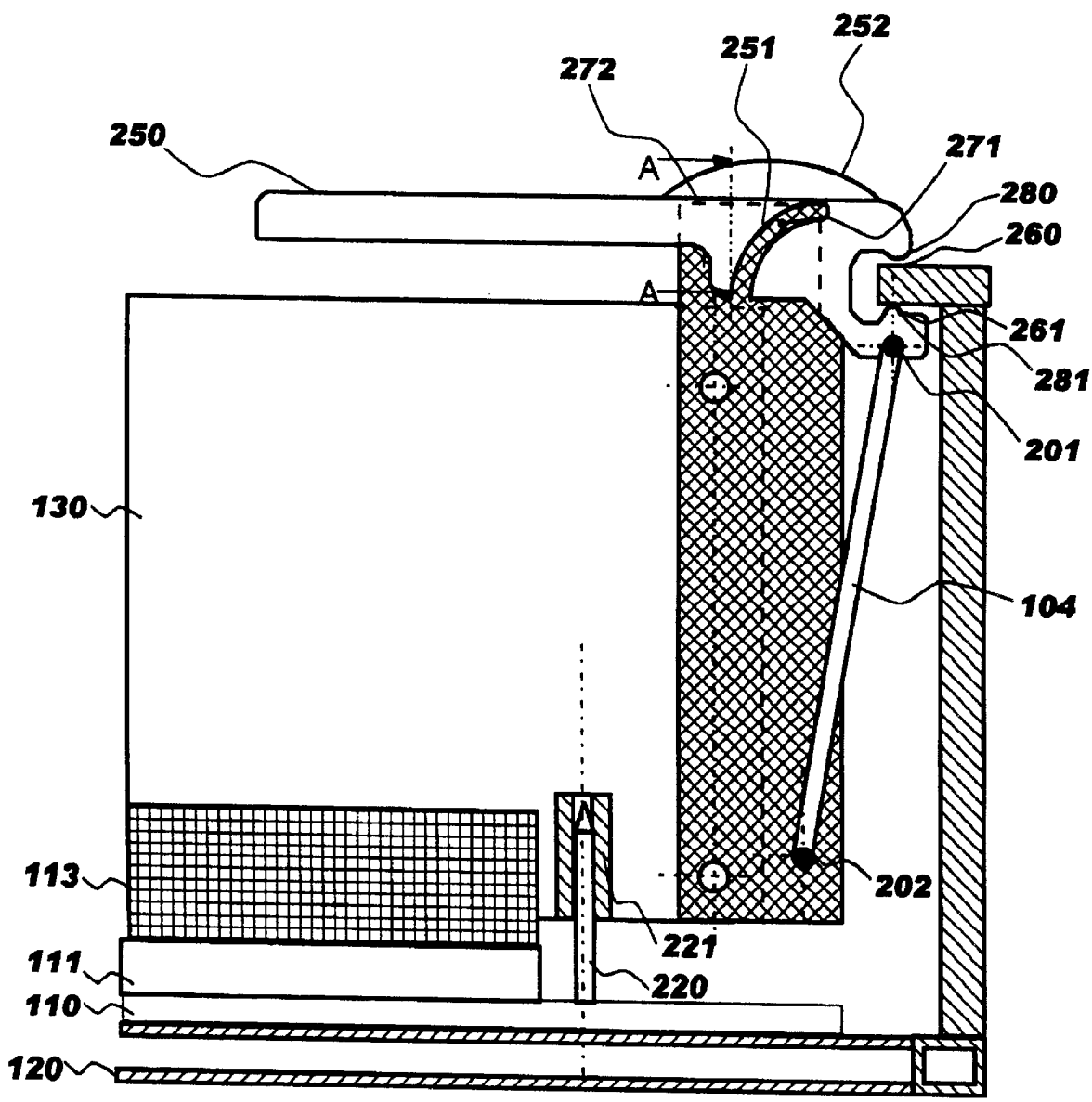
FIG. 2. Shows an enlarged front view of the right side of the printed circuit board, the chassis, the backplane and the apparatus according to the invention in the engaged position.
Figure 3:
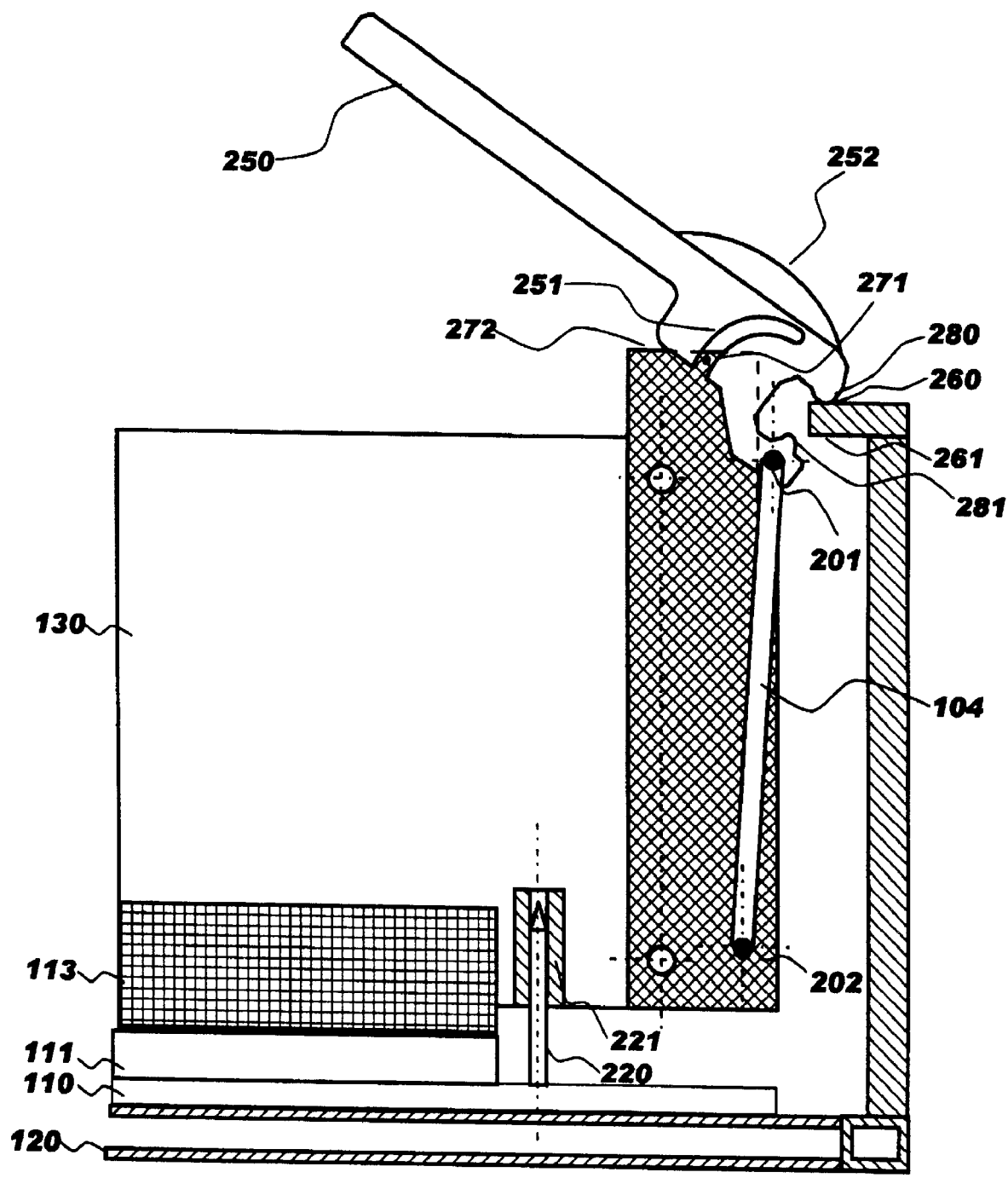
FIG. 3. Illustrates an enlarged front view of the right side of the printed circuit board, the chassis, the backplane and the apparatus according to the invention in the released position.

When operated, mechanism 100 moves from an engaged or locked position (shown on FIG. 2) to a released or retracted position (shown in FIG. 3).

Figure 4:
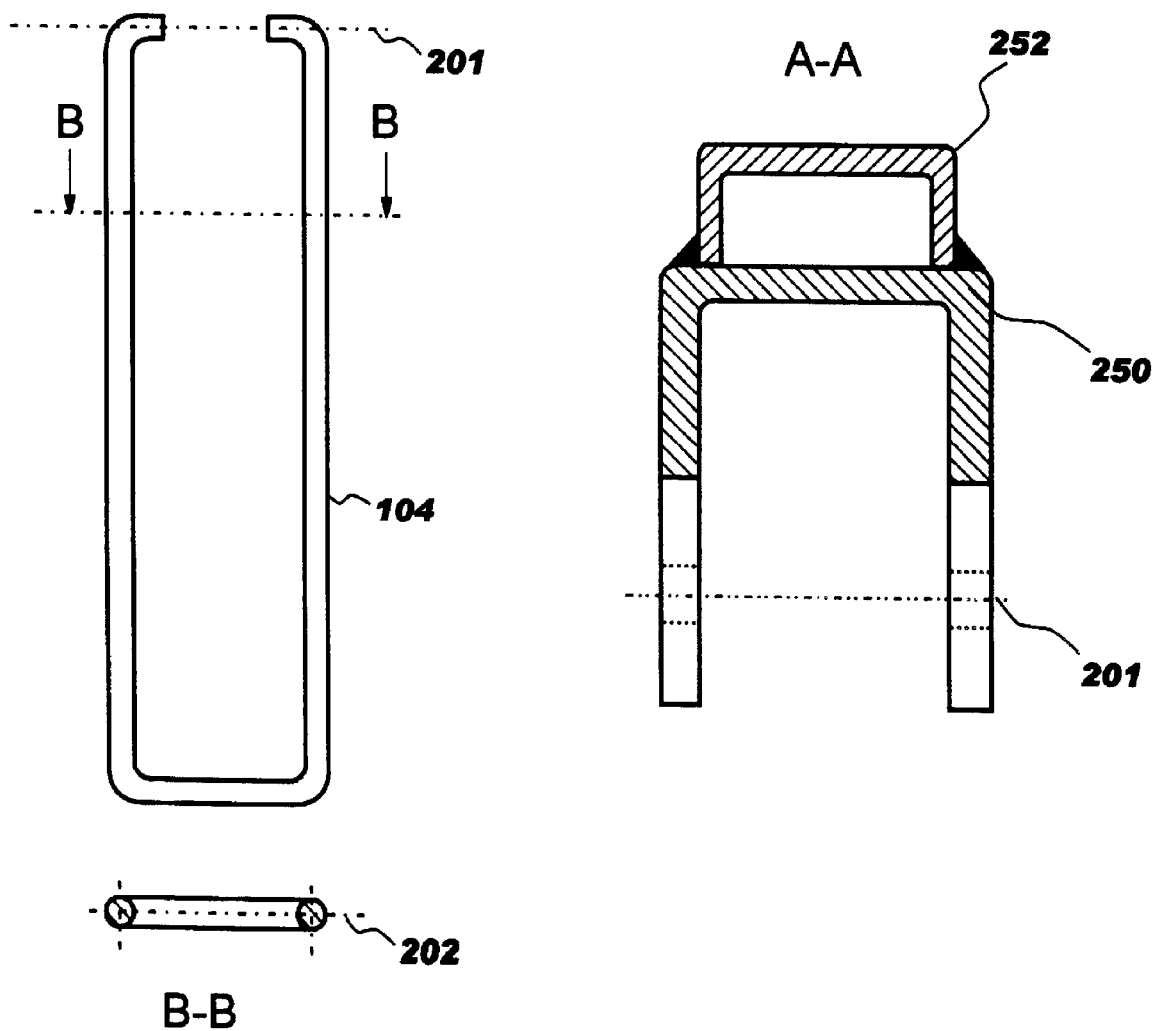
FIG. 4. Shows a profile view of a rod and a cut view of a lever.

Referring to FIG. 2, lever 102 has an elongated body in the form of a handle 250, an upper cam lever 280, a lower cam lever 281 and a transverse lever pivot through hole 201 located near the lower cam lever. Handle 250 extends perpendicularly to the lever pivot 201 and to both cam levers. As shown on cut view A—A of FIG. 4, lever 102 looks like a reversed U and is preferably made of steel sheet. Lever 102 may further include an open circular slot 251 to guide the rotation of the lever. A swell 252 may be further welded on handle 250 to stiffen lever 102.

In the described embodiment, the PCB 130 is guided perpendicularly to backplane 110 with pin guides 220 that are secured either to the backplane 110 or to the chassis 120. The pin guides 220 may be cylindrical metal parts having a cone-shaped upper end to engage facing pin holes 221 located on the bottom part of the PCB.

The holder 106 is secured to the PCB 130 with screws (as illustrated on FIG. 1) or by any other conventional technique. The rod is positioned relative to the holder, by insertion into a hole of the holder that acts as a rod pivot. The holder is then pivotally coupled to the rod 104 through the rod pivot 202.

To insert the PCB 130 within the chassis 120, mechanism 100 is moved in engaged position by pushing on handle 250. The description herein is made in reference to one mechanism located on one side of the PCB but the principles described are identical for a second mechanism located on the opposite side of the PCB 130.

Referring to FIG. 2, upper cam lever 280 contacts chassis 120 on an upper contact area 260. Lever 102 rotates around upper contact area 260 until lower cam lever 281 contacts the chassis 120 on a lower contact area 261. Lever 102 and lever pivot 201 then rotate around lower contact zone 261 actuating rod 104 downwards. Rod 104 pulls holder 106 secured to the PCB 130 downward into the chassis.

As rod 104 rotates also around holder 106 with rod pivot 202 and as pin hole 221 contacts pin guide 220, holder 106 and PCB 130 move downward vertically. The mechanical force required to mate PCB connector 113 with backplane connector 111 is applied at a point much closer to the PCB connector then prior art solutions, thereby reducing the risk of damage coincident with PCB insertion and extraction.

If the operator continues pushing on handle 250, PCB 130 is moved further downward until lower contact zone 261, pivot 201 and pivot 202 are aligned. The mechanism 100 then reaches a static position where lever 102 and handle 250 are substantially horizontal.

If counterclockwise pressure on handle 250 is exerted after PCB 130 is fully seated in the chassis, lower cam lever 281 continues to rotate around lower contact zone 261, actuating lever pivot 201 and causing rod 104 to move upward. As a consequence, rod pivot 202, holder 106 and PCB 130 are moved upward slightly, thereby avoiding damage to PCB 130. Movement of handle 250 is stopped when it contacts the upper boundary 272 of holder 106. The physical tolerance between the handle 250 and upper boundary 272 of holder 106 is very small since a larger dimension would cause the PCB to disengage PCB connector 113 from backplane connector 111. The angle formed between rod pivot 202 and lower contact zone 261 is less than 180° when mechanism 100 is in the engaged position and PCB 130 is latched into chassis 120. An upward vertical force applied to the PCB 130 will tend to move lever 102 counterclockwise. As it contacts upper boundary 272, mechanism 100 is in the locked position. The only way to extract the PCB 130 is to pull handle 250, which provides the assurance that PCB connector 113 will not unintentionally disengage from backplane connector 111 and eliminates the need for a screw or other supplemental fastening device.

Rod 104 preferably bends a little during the insertion operation for two reasons. First, it will accommodate the physical clearances and tolerances associated with a particular installation and second, rod 104 will act as a spring reinforcing the latching effect of mechanism 100.

Another advantage of the invention is that when lever 102 is actuated counterclockwise, the operator applies a certain force to mate PCB connector 113 with the backplane connector 111 but once pivot 201 passes beyond the position where pivot 201, contact zone 261 and pivot 202 are aligned, the applied force is significantly reduced. This is due to the spring effect of lever 102, until handle 250 comes in contact with an upper boundary 272. This provides the installer, who cannot see the back end of the PCB a positive feedback indicating that the card is fully seated in the backplane connector.

Another main advantage of the present invention already mentioned is that the force required to mate PCB and backplane connectors is applied at a point near the back end side of the PCB. This approach reduces the bending of the PCB when inserting it into the chassis. Consequently, the risk of damage to an electrical component, trace, solder joint or the connectors is lessened considerably. Neither is a heavy holder required or in some implementations no holder at all may be required. Similarly, a heavy guiding system designed to reduce flexing and deformation of the PCB may be eliminated. However, depending on the system operating environment, a light weight rail guide may be provided. For example, in the case where the system environment subjects the chassis assembly to pronounced accelerative forces or thermal stress.

Accordingly, the invention is directed toward a mechanism that allows a PCB to be firmly secured into the chassis and provides positive feedback to the user indicating the circuit board is fully seated in the chassis and the connectors are securely coupled.

Referring now to FIG. 3, the mechanism 100 is shown in the retracted position. To extract PCB board 130 from chassis 110, the operator pulls handle 250. Lever 102 moves clockwise and lower cam lever 281 and lever pivot 201 rotate around lower contact zone 261. Rod 104 moves rod pivot 202, holder 106 and PCB 130 downward until upper contact zone 260, lever pivot 201 and rod pivot 202 are aligned vertically. Then upper cam lever 280 of lever 102 contacts upper contact zone 260 of chassis 110 and rotates around it. Lever pivot 201 rotates now clockwise around upper contact zone 260. Rod 104, rod pivot 202, holder 106 and PCB 130 continue moving upward vertically. This disengages PCB connector 113 from backplane connector 111. In this position, pin guide 220 is still engaged in pin hole 221, however, at this point the PCB may be extracted manually by the operator from the chassis.

Referring to FIG. 3, swell 252 protruding from lever permits easy manual extraction of the PCB 130. As the operator continues moving handle clockwise, the swell contacts chassis 110 on the upper contact zone 260 and the PCB 130 is further released.

Holder 106 may further comprise a pin 271 to guide the rotation of lever 102 within the open circular slot 251. The circular slot 251 and pin 271 are not required elements for insertion, extraction or latching of the PCB 130, but serve to reduce mechanical stress during insertion and extraction of the PCB. As lever 102 rotates either around upper contact zone 260 or lower contact zone 261 a large clearance is present between open circular slot 251 and pin 271.

FIG. 4a illustrates a profile view (B—B) of a rod 104 utilized in the embodiment described above. The first end of the rod 104 is coupled to the lever 102 at the lever pivot 201 and the second end of the rod 104 is coupled through the holder 106 at the rod pivot 202. FIG. 4b shows a cut view (A—A) of lever 102, including the swell 252, handle 250 and lever pivot 201.

An advantage of the invention is to apply the force necessary to mate the PCB connectors with the backplane connectors at the most optimal location. The invention also provides a positive feedback to the installer that the printed circuit card is fully seated and the connectors are coupled securely. In addition, the invention provides a method for easy securing of the PCB whatever the retention force of the connectors.

The present invention has been described in preferred embodiments that present various advantages, such as smooth latching of the PCB in a chassis and positive feedback for a complete fit. While the invention has been described in detail, the foregoing description is in all aspects illustrative and not restrictive. It is understood that numerous other modifications and variations can be devised without departing from the scope of the invention.

What is claimed is:

1. An apparatus for positioning a printed circuit board within an electronic chassis, the apparatus comprising:
    a lever coupled to a first end of the printed circuit board, the lever being moveable between a first position and a second position to enable a connector mounted on a second end of the printed circuit board to mate with a backplane connector mounted on the electronic chassis;
    a rod having a first end coupled to the lever and a second end coupled to the printed circuit board; and
    a swell to contact the electronic chassis when the lever is moved from the second position to the first position during extraction.

2. The apparatus according to claim 1, wherein the lever further comprises a mechanical pivot joint including an upper cam and a lower cam to contact the electronic chassis when the lever is moved from the first position to the second position.

3. The apparatus according to claim 2, wherein the mechanical pivot joint, a rod pivot which couples the second end of the rod to the printed circuit board and lever pivot which couples the first end of the rod to the lever an arranged to latch the printed circuit board within the electronic chassis when the lever is in the second position.

4. The apparatus according to claim 1, wherein a holder is coupled to a side of the printed circuit board and the second end of the rod is coupled to the holder.

5. The apparatus according to claim 4, wherein the lever further comprises a semicircular slotted guide that mechanically cooperates with a pin mounted on the holder to guide the movement of the lever.

6. The apparatus according to claim 1, wherein the electronic chassis further comprises a pin guide adapted to engage a pin hole located near the connector mounted on the second end of the printed circuit board.

7. The apparatus according to claim 6, wherein the pin guide is attached to the backplane.

8. The apparatus according to claim 1, wherein the electronic chassis further comprises a backplane onto which the backplane connector is attached.

9. An apparatus for positioning a printed circuit board within an electronic chassis, the apparatus comprising:
    a first lever coupled to a first end of the printed circuit board, the first lever being moveable between a first position and a second position to enable a connector mounted on a second end of the printed circuit board to mate with a backplane connector mounted on the electronic chassis;
    a first rod having a first end coupled to the first lever and a second end coupled to a first side of the printed circuit board;
    a second lever coupled to the first end of the printed circuit board, the second lever being moveable between a first position and a second position to enable the connector mounted on the second end of the printed circuit board to mate with the backplane connector mounted on the electronic chassis; and
    a second rod having a first end coupled to the second lever and a second end coupled to a second side of the printed circuit board; and
    a swell to contact the electronic chassis when the first or second lever is moved from the second position to the first position during extraction.

10. The apparatus according to claim 9, wherein a first holder is coupled to the first side of the printed circuit board and the second end of the first rod is coupled to the first holder; and
    a second holder is coupled to the second side of the printed circuit board and the second end of the second rod is coupled to the second holder.

11. A method for positioning a printed circuit board within an electronic chassis, the method comprising the steps of:
    providing a lever coupled to a first end of the printed circuit board, the lever being moveable between a first position and a second position to enable a connector mounted on a second end of the printed circuit board to mate with a backplane connector mounted on the electronic chassis, the lever further comprising a mechanical pivot joint including an upper cam and a lower cam to contact the electronic chassis when the lever is moved from the first position to the second position and a swell to contact the electronic chassis when the lever is moved from the second position to the first position during extraction;
    providing a rod having a first end coupled to the lever and a second end coupled to the printed circuit board; and
    arranging the mechanical pivot joint, a rod pivot coupling the second end of the rod to the printed circuit board and a lever pivot coupling the first end of the rod to the lever, to latch the printed circuit board within the electronic chassis when the lever is in the second position.

12. The method according to claim 11, further comprising coupling a holder to a side of the printed circuit board and the second end of the rod is coupled to the holder.

13. The method according to claim 11 wherein the lever further comprises a semicircular slotted guide that mechanically cooperates with a pin mounted on the holder to guide the movement of the lever.

14. The method according to claim 11 wherein the electronic chassis further comprises a pin guide adapted to engage a pin hole located near the connector mounted on the back end of the printed circuit board.

* * * * *